(12) United States Patent
Wikström et al.

(10) Patent No.: US 11,139,219 B2
(45) Date of Patent: Oct. 5, 2021

(54) BYPASS THYRISTOR DEVICE WITH GAS EXPANSION CAVITY WITHIN A CONTACT PLATE

(71) Applicant: ABB Schweiz AG, Baden (CH)

(72) Inventors: Tobias Wikström, Egliswil (CH); Remo Baumann, Lenzburg (CH); Sascha Populoh, Aarau (CH); Bjoern Oedegard, Turgi (CH)

(73) Assignee: ABB Schweiz AG, Baden (CH)

( * ) Notice: Subject to any disclaimer, the term of this patent is extended or adjusted under 35 U.S.C. 154(b) by 135 days.

(21) Appl. No.: 16/737,334

(22) Filed: Jan. 8, 2020

(65) Prior Publication Data
US 2020/0144141 A1    May 7, 2020

Related U.S. Application Data

(63) Continuation of application No. PCT/EP2018/067901, filed on Jul. 3, 2018.

(30) Foreign Application Priority Data

Jul. 13, 2017  (EP) ..................... 17181298

(51) Int. Cl.
*H01L 29/74* (2006.01)
*H01L 23/20* (2006.01)
(Continued)

(52) U.S. Cl.
CPC ............ *H01L 23/20* (2013.01); *H01L 23/492* (2013.01); *H01L 25/18* (2013.01);
(Continued)

(58) Field of Classification Search
CPC ....... H01L 23/20; H01L 23/492; H01L 25/18; H01L 29/0834; H01L 29/0839;
(Continued)

(56) References Cited

U.S. PATENT DOCUMENTS 3,975,758 A * 8/1976 Schlegel ............... H01L 23/051
257/689
4,399,452 A * 8/1983 Nakashima ........... H01L 23/051
257/683
(Continued)

FOREIGN PATENT DOCUMENTS

| EP | 0220698 A2 | 5/1987 | |
| EP | 0220698 A2 * | 6/1987 | ........... H01L 23/051 |
| WO | 2013044961 A1 | 4/2013 | |

OTHER PUBLICATIONS

European Patent Office, International Search Report & Written Opinion issued in corresponding Application No. PCT/EP2018/067901, dated Sep. 28, 2018, 10 pp.
(Continued)

*Primary Examiner* — Charles D Garber
*Assistant Examiner* — S M Sohel Imtiaz
(74) *Attorney, Agent, or Firm* — Slater Matsil, LLP

(57) ABSTRACT

A bypass thyristor device includes a semiconductor device providing a thyristor with a cathode electrode on a cathode side, a gate electrode on the cathode side surrounded by the cathode electrode and an anode electrode on an anode side; an electrically conducting cover element arranged on the cathode side and in electrical contact with the cathode electrode on a contact side; and a gate contact element electrically connected to the gate electrode and arranged in a gate contact opening in the contact side of the cover element; wherein the cover element has a gas expansion
(Continued)

volume in the contact side facing the cathode side, which gas expansion volume is interconnected with the gate contact opening for gas exchange.

20 Claims, 3 Drawing Sheets

(51) Int. Cl.
    *H01L 23/492*     (2006.01)
    *H01L 25/18*     (2006.01)
    *H01L 29/08*     (2006.01)
    *H01L 29/10*     (2006.01)
    *H01L 29/417*     (2006.01)
    *H02M 7/162*     (2006.01)

(52) U.S. Cl.
    CPC ...... *H01L 29/0834* (2013.01); *H01L 29/0839* (2013.01); *H01L 29/1012* (2013.01); *H01L 29/41716* (2013.01); *H01L 29/74* (2013.01); *H02M 7/162* (2013.01)

(58) Field of Classification Search
    CPC ........... H01L 29/1012; H01L 29/41716; H01L 29/74; H01L 23/62; H01L 23/051; H02M 7/162; H02M 1/32
    See application file for complete search history.

(56) References Cited

U.S. PATENT DOCUMENTS

| | | | | |
|---|---|---|---|---|
| 5,156,981 | A * | 10/1992 | Kitagawa | H01L 23/051 257/E21.388 |
| 2005/0082692 | A1 * | 4/2005 | Park | H01L 23/049 257/796 |
| 2008/0042142 | A1 * | 2/2008 | Sugawara | C08G 77/04 257/77 |
| 2013/0312835 | A1 * | 11/2013 | Minshall | H01L 21/67201 137/12 |
| 2016/0203929 | A1 * | 7/2016 | Jung | H01H 39/004 200/48 R |

OTHER PUBLICATIONS

Ladoux et al., "Comparative study of variant topologies for MMC," IEEE, 2014 International Symposium on Power Electronics, Electrical Drives, Automation and Motion, pp. 659-664.

* cited by examiner

US 11,139,219 B2

BYPASS THYRISTOR DEVICE WITH GAS EXPANSION CAVITY WITHIN A CONTACT PLATE

FIELD OF THE INVENTION

The invention relates to a bypass thyristor device and a converter cell with such a bypass thyristor device.

BACKGROUND OF THE INVENTION

A modular multi-level converter (MMC) may convert electric power from high voltage alternating current (AC) to direct current (DC), or vice versa. An application example is a high voltage direct current (HVDC) transmission system that transports electrical energy over long distances or between AC power systems of different frequencies. In order to convert high voltages (such as several hundred kV) and high power (for example in the GW range), a converter station may comprise a plurality of such MMCs.

Each MMC may utilize a cascade of independent inverter submodules or converter cells, each having its own storage capacitor, which also may be called cell capacitor. In a phase branch of the MMC, the converter cells are usually connected in series. The converter cells may be controlled independently from each other, so that an AC current may be generated from a DC current in as many levels as converter cells are available.

MMC converters are normally designed to include redundancy by increasing the number of converters cells to more converter cells than are needed. In the case of a failure, the failed converter cell may have to be discharged and bypassed to avoid over-charging a DC-link capacitor. This function is usually provided by a bypass switch. The stored energy in the converter cell can be substantial, even exceeding 100 kJ, making it a challenge to discharge the converter cell without inflicting more damage to the converter cell itself or surrounding ones.

One possibility for such a bypass switch is a mechanical switch driven by explosives. Such a pyrotechnical device may be expensive and may require effort to structurally fit it in the converter so that it can be easily replaced and serviced while keeping volume, stray impedance and capacitance minimal. In addition, the explosive charge may need routine replacement to guarantee function, and the mechanical parts may need maintenance. In the case of a failure of the bypass switch itself, it fails in the open state so that the capacitor may be destroyed by overcharging.

As a further example, WO 2013/044961 A1 describes the use of a thyristor as bypass thyristor.

EP 0220 698 A2 relates to a thyristor with a circular housing, in which a gate contact is guided through a slit in a covering plate and through a radial opening in an isolating ring to the outside.

DESCRIPTION OF THE INVENTION

It is an objective of the invention to provide a reliable, simple to integrate, simple to maintain and economic bypass switch for a converter cell.

This objective is achieved by the subject-matter of the independent claims. Further exemplary embodiments are evident from the dependent claims and the following description.

An aspect of the invention relates to a bypass thyristor device. Basically, a bypass device may be any device adapting for bypassing another electrical device, which may be performed by triggering a bypass switch into a conducting state. The present bypass device is based on a thyristor as bypass switch and may comprise a semiconductor device together with a housing, encapsulating the semiconductor device and providing electrical contacts. The semiconductor device may be or may comprise a semiconductor wafer or a semiconductor chip. It has to be noted that the present disclosure may relate to power bypass thyristor devices, which are adapted for processing voltages above 600 V and/or above 10 A.

According to an embodiment of the invention, the bypass thyristor device comprises a semiconductor device comprising a thyristor with a cathode electrode on a cathode side, a gate electrode on the cathode side surrounded by the cathode electrode and an anode electrode on an anode side. The cathode side and the anode side may be opposite sides on the semiconductor device. The semiconductor device may be a substantially circular plate, in which the elements of the thyristor have been doped. The cathode electrode, the gate electrode and the anode electrode may be provided by metallization layers on the substrate of the semiconductor device.

The bypass thyristor device furthermore comprises an electrically conducting cover element arranged on the cathode side and in electrical contact with the cathode electrode on a contact side and a gate contact element electrically connected to the gate electrode and arranged in a gate contact opening in the contact side of the cover element. The gate contact opening may be a bore in the cover element, in which the gate contact element is accommodated. The gate contact element may be electrically connected with a cable that is guided through the cover element with an outside of the bypass thyristor device.

The bypass thyristor device furthermore may comprise a further cover element that is arranged on the anode side and in electrical contact with the anode electrode. This further cover element may be seen as anode cover element and the other cover element as cathode cover element. Both cover elements may be mechanically interconnected with an electrically isolating flange, which may surround the semiconductor device. The cover elements and the isolating flange, which may be made of ceramics, may be seen as a housing of the bypass thyristor device. The isolating flange and the cover element constitute a hermetic seal for the interior of the housing.

The cathode cover element has a gas expansion volume in the contact side facing the cathode side, which gas expansion volume is interconnected with the gate contact opening for gas exchange. The gas expansion volume and the semiconductor device form a cavity in the bypass thyristor device, which is adapted for receiving gas and/or plasma that evaporates from the semiconductor device in the case of a thermal destruction of the thyristor and/or the semiconductor device. This may be the case, when a current through the thyristor becomes higher than a maximal surge current of the thyristor.

For example, such an event may take place, when the charge of a cell capacitor that is short-circuited by the bypass switch device is strongly charged. Furthermore, such an event may be intended for forming a permanently conducting path through the semiconductor device. Due to the high current, the material of the semiconductor device may melt and may form a conducting path. Without the gas expansion volume, plasma and/or gas created within the semiconductor device may create a high pressure on the cover element, which may cause the housing of the bypass thyristor device to rupture. Additionally, the walls of the gas expansion volume may cool the gas and may facilitate condensing.

A bypass thyristor device with such a gas expansion volume may have an improved non-rupture capability, without adding production cost. This may enable the design of higher power MMC converter cells without increasing the cost of the bypass solution.

According to an embodiment of the invention, a volume of the gas expansion volume is larger than a volume of the gate contact opening. It may be that the volume of the gas expansion volume is at least 10 times larger than the volume of the gate contact opening. The volume of the gas expansion volume may depend on an average amount of gas generated during the bypass operation. The optimal volume may be determined with experiments.

According to an embodiment of the invention, the gas expansion volume is divided into at least two separate cavities interconnected for gas exchange. It may be beneficial that the gas expands into a plurality of cavities. On the one hand, the mechanical stability of the cover element may be enhanced by more but smaller cavities. On the other hand, the surface of the gas expansion volume may be increased, which surface may cool the evaporated gas.

According to an embodiment of the invention, the gas expansion volume comprises at least one trench surrounding the gate contact opening. For example, such trenches may be machined into the cover element. Such trenches also may have a height larger than the height of the gate contact opening.

According to an embodiment of the invention, the at least one trench is interconnected with the gate contact opening via at least one channel provided in the contact side. Such a channel may have a cross-sectional area smaller than the at least one trench. Furthermore, the gate contact opening and the at least one trench may be interconnected with a plurality of channels.

According to an embodiment of the invention, the gas expansion volume comprises at least two trenches surrounding the gate contact opening. The trenches may be linked with each other like the gate contact opening is linked with one of the trenches.

According to an embodiment of the invention, the at least two trenches are interconnected with each other via at least one channel provided in the contact side, which may have a cross-sectional area smaller than each trench. Two trenches may be interconnected with a plurality of channels.

According to an embodiment of the invention, the cover element comprises a gate cable trench, in which a gate cable is arranged, which is electrically connected to the gate contact element. The gate contact cable may be guided through the gate cable trench to an outside of the bypass thyristor device. The gate cable trench may be smaller than the gas expansion volume and/or its trenches. It only may have a cross-section adapted for accommodating the gate contact cable. The amount of gas, which is pressed through the gate cable trench and reaching the internal air of the bypass thyristor device may be significantly reduced or even eliminated with the gas expansion volume. The need for protecting the isolating flange and the cover elements of the housing may be lowered or eliminated.

According to an embodiment of the invention, a cross-sectional area of the gate cable trench is smaller than a cross-section area of one or more channels interconnecting the gate contact opening with the gas expansion volume. The channels may be adapted for equalizing pressure between the gate contact opening and the gas expansion volume and/or between different cavities of the gas expansion volume. The gate cable trench only may accommodate the gate cable and may be rather small.

According to an embodiment of the invention, the semiconductor device has a circular shape and the gate electrode is arranged in a centre of the circular shape. The gas expansion volume may comprise one or more circular trenches, which surround the gate contact opening, which may be arranged above the gate electrode. Furthermore, the channels interconnecting the gate contact opening and the one or more circular trenches are arranged in a radial direction with respect to the centre. This may provide a mechanical stable cover element with a larger gas expansion volume that accounts for the geometry of a circular semiconductor device.

According to an embodiment of the invention, the bypass thyristor device further comprises an anode side cover element electrically connected to the anode electrode and an electrically isolating flange surrounding the semiconductor device, to which flange the cathode side cover element and the anode side cover element are attached. As already mentioned, the housing of the bypass thyristor device may be made of two cover elements interconnected with an isolating flange that may be made of ceramics.

According to an embodiment of the invention, the thyristor is adapted for forming a permanent conducting path through an active area of the semiconductor device, when a current flowing through the semiconductor switch exceeds a maximal current. Such a path may be formed, when a current through the thyristor melts the material of the semiconductor device. In this case, gas may be generated that is received by the gas expansion volume.

According to an embodiment of the invention, for forming the thyristor, the semiconductor device comprises from the cathode side to the anode side following layers: a cathode layer of a first conductivity type (such as n+) connected to the cathode electrode; a base layer of a second conductivity type (such as p) different from the first conductivity type connected to the gate electrode; a drift layer of the first conductivity type (such as n−); and an anode layer of the second conductivity type (such as p) connected to the anode electrode. In an active area, in which active area the cathode electrode contacts the cathode layer, the semiconductor device comprises a first region, in which a mean value of a carrier lifetime between the cathode side and the anode side has a first value, and a second region, in which a mean value of the carrier lifetime between the cathode side and the anode side has a second value, which is smaller than the second value.

In other words, the active region of the semiconductor device is divided into a first, longer carrier lifetime region and a second, shorter carrier lifetime region.

With such a thyristor, a short-circuit failure mode for a converter cell may be provided, in which the thyristor may act as bypass switch for a cell capacitor. The first region of longer carrier lifetime may trigger the thyristor and conduct current. The second region of shorter carrier lifetime may not contribute significantly in conducting the current, forcing it to flow mainly through the longer lifetime region. As a consequence, the switch may fail reliably with less stored energy on the cell capacitor due to the first region only being part of the active region of the semiconductor device. The second, reduced carrier lifetime region may increase an on-state voltage to such areas in which virtually no current flows and may increase the semiconductor volume, in which heat can be spread in case of a short-circuit failure.

According to an embodiment of the invention, the second value is at most 75% of the first value. This may ensure a reliable triggering of the thyristor.

According to an embodiment of the invention, the first region is arranged between the gate electrode and the anode electrode. In other words, the second region may be a central region, which is circumvented by the first region. In the short-circuit failure mode, all material around the first region may be contributed to forming a conducting path.

However, also other types of thyristors, which may be triggered into a short-circuit failure mode, may be used for the bypass thyristor device.

A further aspect of the invention relates to a converter cell, which comprises a bypass thyristor device as described in the above and in the following. Such converter cells may be interconnected for forming a converter, such as a modular multi-level converter. In the case, the converter cell has a failure, the bypass thyristor may be triggered to discharge a cell capacitor of the converter cell. In such a way, redundant converter cells may be disconnected.

It has to be noted that features of the bypass thyristor device may be features of the converter cell and vice versa.

According to an embodiment of the invention, the converter cell comprises at least two power semiconductor switches for connecting a cell capacitor with an output of the converter cell and for disconnecting the cell capacitor from the output, and a bypass thyristor device as described in the above and in the following connected in parallel to the cell capacitor.

The converter cell may comprise one or more half-bridges composed of two series connected power semiconductor switches. The half-bridges may be connected in parallel with the cell capacitor and the bypass thyristor. The output of the converter cell may be provided by midpoints of the half-bridges.

The power semiconductor switches for switching the current through the converter cell may be transistors or thyristors, such as integrated gate bipolar transistors (IGBTs) or insulated gate commutated thyristors (IGCTs). However, although when being thyristors, these power semiconductor switches may have a different design as the bypass thyristor device. The requirements on the bypass thyristor device may differ greatly from the requirements on the other switches of the converter cell, since the bypass thyristor device is blocking during normal operation of the converter cell. With neither conduction nor switching losses in normal operation, the bypass thyristor device may assume a cooling medium temperature, approximately. Hence, the requirements for load- and temperature cycling can be excluded entirely, compared to the switches of the converter cell. The requirement reductions offer more design freedom in terms of thermal resistance and load cycling resilience. Thus, a bypass thyristor device as described in the above and in the following, for example based on a thyristor and/or with an active region divided into a first region and a second region with different carrier lifetimes as described in the above and in the following, may be used.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

Detailed Description of Exemplary Embodiments

Figure 1:
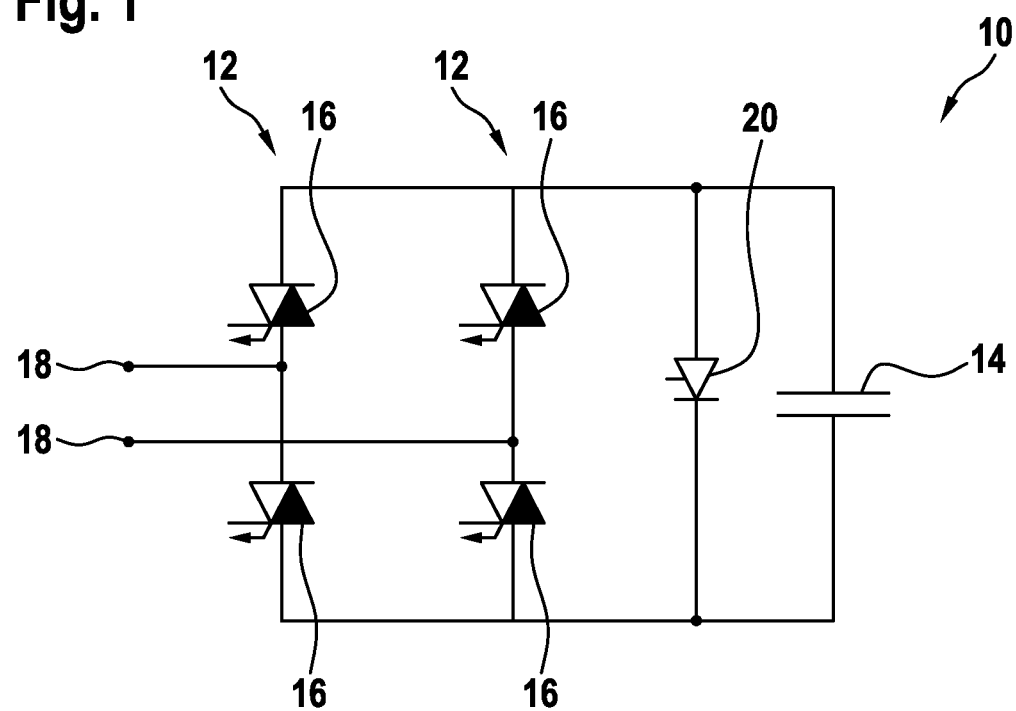
FIG. 1 schematically shows a circuit diagram of a full-bridge converter cell according to an embodiment of the invention.

FIG. 1 shows a converter cell 10, which comprises a full bridge 12 interconnected in parallel to a cell capacitor 14. The full bridge 12 is composed of four reverse-conducting semiconductor switches 16 (here IGCTs) for attaching the cell capacitor directly or in reverse to the output terminals (18), or to disconnect it. The outputs 18 of the converter cell 10 are provided by the mid-points of the half-bridges 12, which outputs 18 may be disconnected to the cell capacitor 14 and may be connected to the cell capacitor in two directions, i.e. the converter cell 10 is a bipolar cell. It also may be that the converter cell 10 is a unipolar cell or has another switch topology. Converter cells like the converter cell 10 shown in FIG. 1 may be series connected to form an arm of a modular multi-level converter (MMC).

Additionally, the converter cell 10 comprises a bypass thyristor device 20, which is adapted for short-circuiting the cell capacitor 14.

Figure 2:
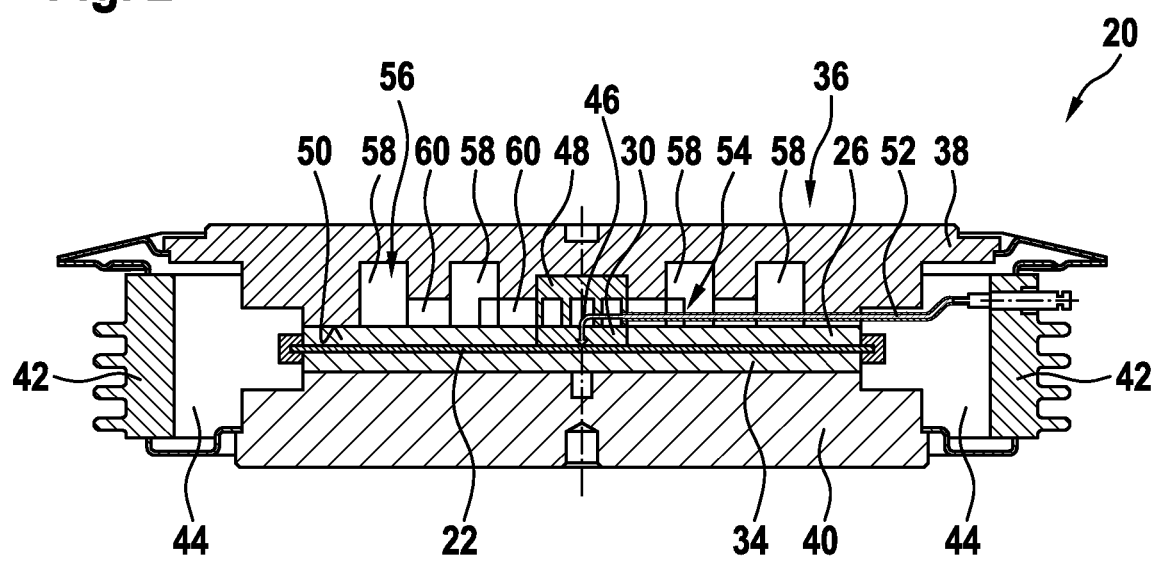
FIG. 2 schematically shows a cross-sectional view of a bypass thyristor device according to an embodiment of the invention.

FIG. 2 shows the bypass thyristor device 20 in more detail. The bypass thyristor device 20 comprises a semiconductor device 22 comprising or providing a thyristor 24. The semiconductor device 22 is provided with a cathode electrode 26 and a gate electrode 30 on the cathode side 28, which gate electrode 30 is surrounded by the cathode electrode 26. On the other, anode side 32, the semiconductor device 22 is provided with an anode electrode 34.

The semiconductor device 22 may be made of doped Si or doped SiC as substrate. The cathode electrode 26, a gate electrode 30 and anode electrode 34 may be metallization layers on the substrate of the semiconductor device 22. The semiconductor device 22, which is shown in cross-section from the side in FIG. 2, may have a circular shape, when viewed from above.

The semiconductor device 22 is enclosed in a housing 36 of the bypass thyristor device 20, which comprises a cathode side cover element 38 and an anode side cover element 40, which sandwich the semiconductor device 22 in between them. The cover elements 38, 40 are electrically conducting and are in direct electrical contact with the cathode electrode 26 and the anode electrode 34, respectively. For example, the cover elements may be made of metal, such as Cu or Al.

The cover elements 38, 40 are spaced apart by an electrical isolating flange 42, which surrounds the semiconductor device 22 and/or which may be made of ceramics. Between the cover elements 38, 40 and inside the flange 42 radial outside of the semiconductor device 22, an outer interior space 44 is present, which may be filled with air.

The gate electrode 30 may be situated in the centre of the semiconductor device 22. A gate contact element 46, which is directly electrically connected to the gate electrode 30, is arranged in a gate contact opening 48 in a contact side 50 of the cover element 38. For example, the gate contact element is soldered or sintered to the gate electrode 30.

The gate contact element 46 is electrically connected to a gate contact cable 52, which is guided through a gate cable trench 54 to an outside of the bypass thyristor device 20. The gate cable trench 54 is provided in the contact side 50 of the cover element 38. The gate contact cable 52 may be guided through the flange 42 through a further opening.

Additionally, the cover element 38 has a gas expansion volume 56, which is provided in the contact side 50, which may be composed of one or more cavities 58, which are interconnected for gas exchange with the gate contact opening 48. Such a gas exchange may be made by channels 60, which are provided in the contact side 50 and which interconnect the cavities 58 with each other and with the gate contact opening 48.

The gas expansion volume 56 is used for mitigating an influence of a gas and/or plasma generated by the semiconductor device 22 through a high current event. Triggering the bypass thyristor device 20 at high stored energy in the cell capacitor 14 may release a current that exceeds the surge-current capability of the bypass thyristor device 20 by orders of magnitude. An active area of the semiconductor device 22 may melt and may evaporate into gaseous form. This gas may be received in the gas expansion volume 56, its pressure may be reduced and/or it may be cooled.

In a contact element without gas expansion volume 56, there may be almost no volume available for the created gas. Hot gas may travel along the gate cable trench 54 and into the internal space 44, where it endangers the integrity of the ceramic flange 42 and a sealing of the cover elements 38, 40. It may also create enough pressure to separate the surfaces and escape through the sealing ring.

As shown in FIG. 2, the volume of the gas expansion volume 56 may be larger by a factor of 2 and more as the volume of the gate contact opening 48. This may be achieved by deeper and/or wider cavities 58 compared to the gate contact opening 48.

As the gate contact opening 48 and the gate cable trench 54, the cavities 58 and the channels 60 may be machined into the cover element 38.

Figure 3:
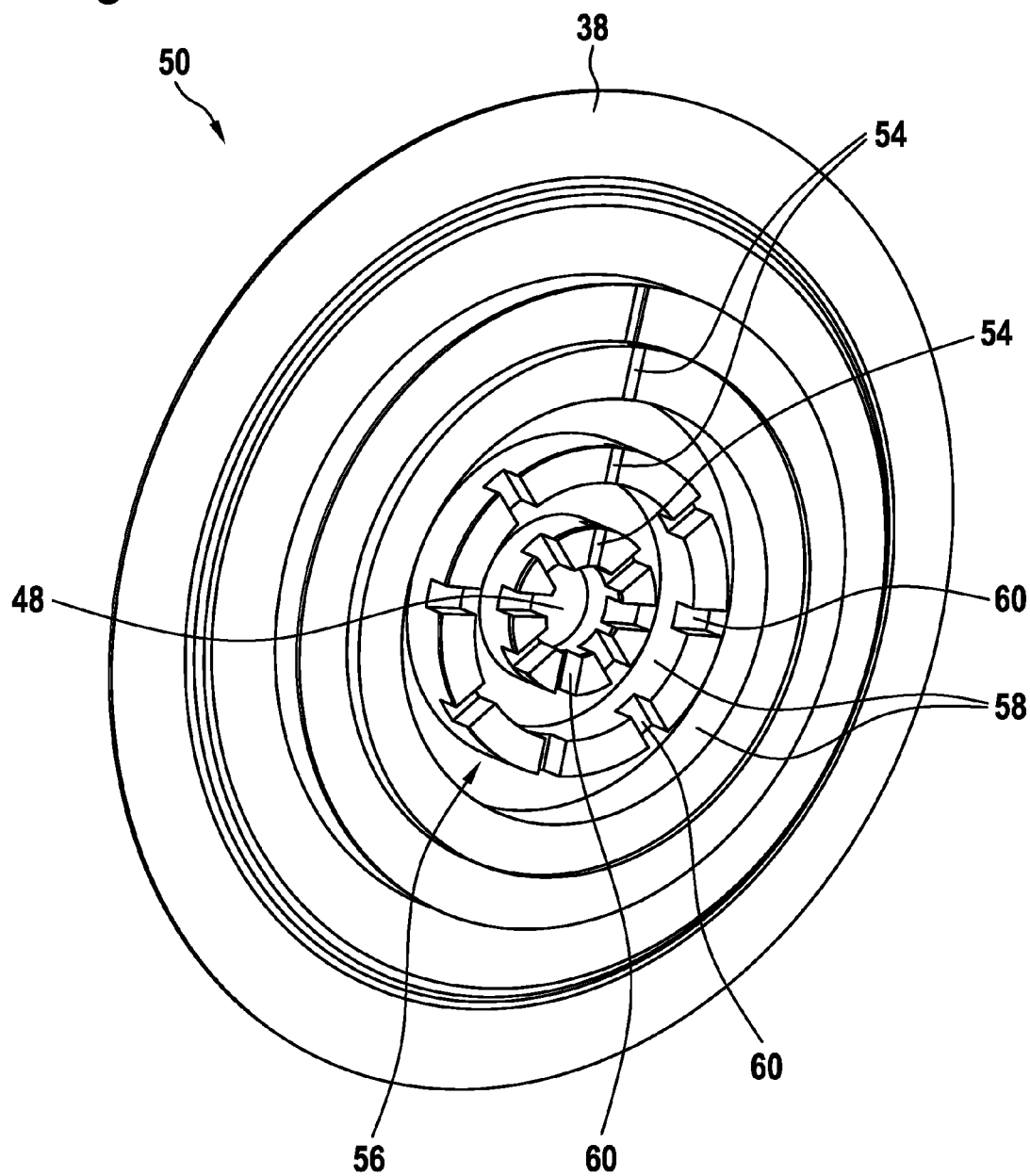
FIG. 3 shows a perspective view of a cover element for a bypass thyristor device according to an embodiment of the invention.

FIG. 3 shows an embodiment of the cover element 38 in a perspective view from a direction towards to contact side 50. The gate contact opening 48 may be a central bore, which is surrounded by coaxial ring-shaped cavities 58 in the form of trenches. The trenches 58 and the gate contact opening 48 are interconnected with radial running channels 60, which may have a smaller cross-sectional area as the trenches 58. Also the gate cable trench 54, which may have a smaller cross-sectional area as the channels 60, may run in a radial direction.

It can be seen that the only possibility for gas exchange between the gas expansion volume 56 and the interior space 44 may be via the gate cable trench 54, which may have a cross-sectional area substantially as the gate contact cable 52. Thus, most of the gas generated by an above mentioned event may stay within the gas expansion volume 56.

Figure 4:
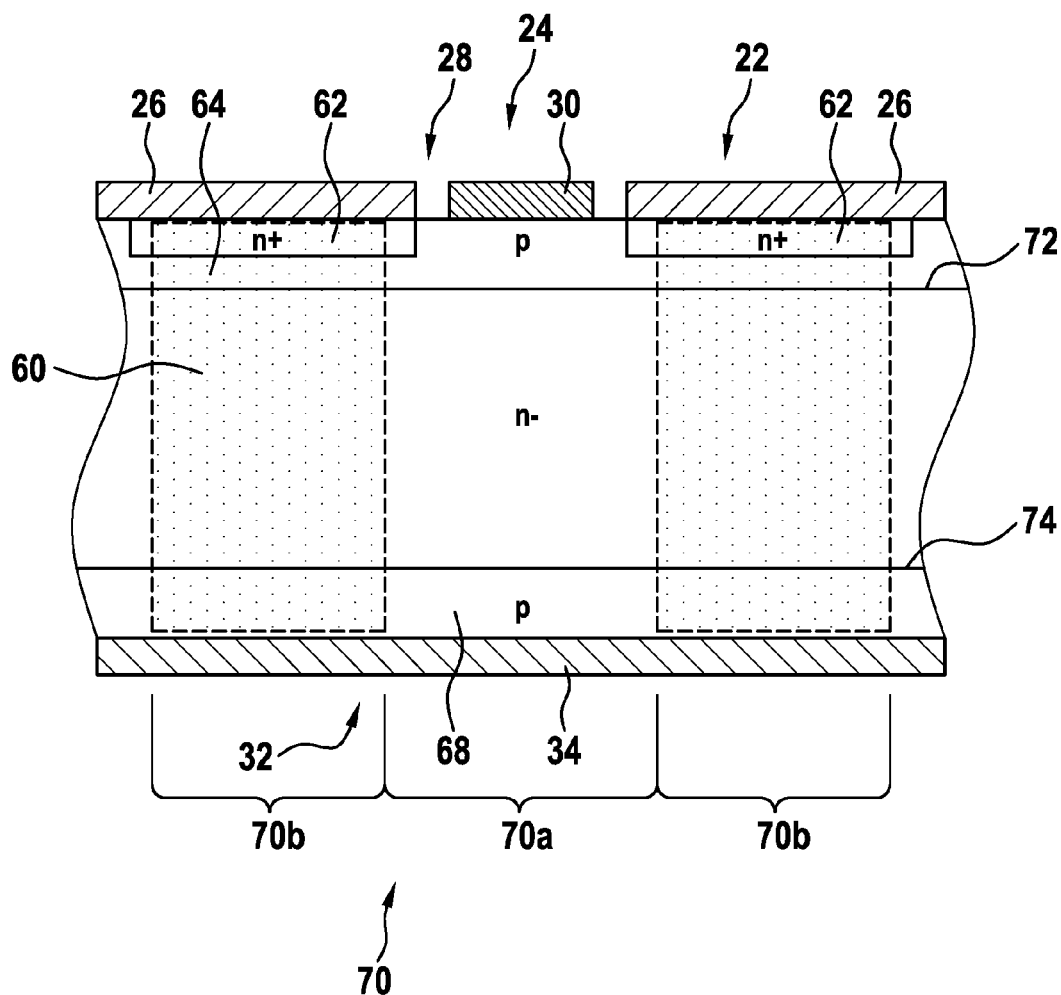
FIG. 4 schematically shows a cross-sectional view of a semiconductor device for a bypass thyristor device according to an embodiment of the invention.

It also may be that the semiconductor device 22 intentionally melts during a high energy event to form a conducting path through the bypass thyristor device 20. Such a semiconductor device 22 is shown in FIG. 4.

From the cathode side 28 to the anode side 32 opposite to the cathode side 28, the semiconductor device 22 comprises an n+ doped cathode layer 62, a p doped base layer 64, an n− doped drift layer 66 and a p doped anode layer 68. The cathode electrode 26 is provided on the cathode layer 62 and the anode electrode 34 is provided on the anode layer 68.

The gate electrode 30 is provided on the base layer 64, in which the cathode layer 62 is embedded. The base layer 64 may be a continuous layer below the cathode layer 62. A bottom and lateral sides of the cathode layer of the cathode layer 62 may contact the base layer 64.

An active region 70 of the semiconductor device 22, which may be seen as a region, in which the cathode electrode 26 contacts the cathode layer 62, is divided into a first region 70a, which extends from the cathode side 28 to the anode side 32, in which a mean value of a carrier lifetime between the cathode side 28 and the anode side 32 has a first value, and a second region 70b, in which a mean value of the carrier lifetime between the cathode side 28 and the anode side 42 has a second value, which may be smaller as the first value. The second value may be at most 75% of the first value.

For example, in all planes parallel to the cathode side 28, the mean carrier lifetime in the second region 70b may be smaller, such as at most 75%, as the mean carrier lifetime in the first region 70a in the same plane.

In a further example, the mean carrier lifetime in the second region 70b between the first and second pn junctions 72, 74 may be smaller, such as at most 75%, as the mean carrier lifetime in the first region.

In a plane parallel to the cathode side 28, the area of the first region 70a may be at least 0.1% of the area of the active region 70. Such a small area (or more precisely the region in projection of this area to the cathode side 28 and anode side 32) may be sufficient to ignite the bypass thyristor 24 in the case of short-circuit failure mode (SCFM). However, the area of the first region 70a also may have a size of at most 50% or at most 5% of the area of the active region 70. That means that in an exemplary embodiment, the second region 70b may have a size between 50% and 99.9% of the area of the active region 70 (in a plane parallel to the cathode side 28).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 converter cell
12 half-bridge
14 cell capacitor
16 semiconductor switch
18 output
20 bypass thyristor device
22 semiconductor device
24 thyristor
26 cathode electrode 28 cathode side
30 gate electrode
32 anode side
34 anode electrode
36 housing
38 cover element
40 cover element
42 flange
44 interior space
46 gate contact element
48 gate contact opening
50 contact side
52 gate contact cable
54 gate cable trench
56 gas expansion volume
58 cavity, trench
60 channel
62 cathode layer
64 base layer
66 drift layer
68 anode layer
70 active region
70a first region
70b second region
72 first pn junction
74 second pn junction

The invention claimed is:

1. A bypass thyristor device, comprising:
a semiconductor device comprising a thyristor with a cathode electrode on a cathode side,
a gate electrode on the cathode side surrounded by the cathode electrode and
an anode electrode on an anode side;
an electrically conducting cover element arranged on the cathode side and in electrical contact with the cathode electrode on a contact side;
a gate contact element electrically connected to the gate electrode and arranged in a gate contact opening in the contact side of the cover element;
wherein the cover element has a gas expansion volume in the contact side facing the cathode side,
wherein the gas expansion volume is interconnected with the gate contact opening for gas exchange.

2. The bypass thyristor device of claim 1, wherein a volume of the gas expansion volume is larger than a volume of the gate contact opening.

3. The bypass thyristor device of claim 1, wherein the gas expansion volume is divided into at least two separate cavities interconnected for gas exchange.

4. The bypass thyristor device of claim 1, wherein the gas expansion volume comprises at least one trench surrounding the gate contact opening.

5. The bypass thyristor device of claim 4, wherein the at least one trench is interconnected with the gate contact opening via at least one channel provided in the contact side.

6. The bypass thyristor device of claim 1, wherein the gas expansion volume comprises at least two trenches surrounding the gate contact opening.

7. The bypass thyristor device of claim 6, wherein the at least two trenches are interconnected with each other via at least one channel provided in the contact side.

8. The bypass thyristor device of claim 1, wherein the cover element comprises a gate cable trench, in which a gate contact cable is arranged, which is electrically connected to the gate contact element; wherein the gate contact cable is guided through the gate cable trench to an outside of the bypass thyristor device.

9. The bypass thyristor device of claim 8, wherein a cross-sectional area of the gate cable trench is smaller than a cross-section area of one or more channels interconnecting the gate contact opening with the gas expansion volume.

10. The bypass thyristor device of claim 1, wherein the semiconductor device has a circular shape and the gate electrode is arranged in a centre of the circular shape;
wherein the gas expansion volume comprises one or more circular trenches surrounding the gate contact opening arranged above the gate electrode.

11. The bypass thyristor device of claim 1, further comprising:
an anode side cover element electrically connected to the anode electrode;
an electrically isolating flange surrounding the semiconductor device, to which flange the cathode side cover element and the anode side cover element are attached.

12. The bypass thyristor device of claim 1, wherein the thyristor is adapted for forming a permanent conducting path through an active area of the semiconductor device, when a current flowing through the thyristor exceeds a maximal current.

13. The bypass thyristor device of claim 1, wherein, for forming the thyristor, the semiconductor device comprises from the cathode side to the anode side following layers:
a cathode layer of a first conductivity type connected to the cathode electrode;
a base layer of a second conductivity type different from the first conductivity type connected to the gate electrode;
a drift layer of the first conductivity type;
an anode layer of the second conductivity type connected to the anode electrode;
wherein in an active area the semiconductor device comprises a first region, in which a mean value of a carrier lifetime between the cathode side R and the anode side has a first value, and a second region, in which a mean value of the carrier lifetime between the cathode side and the anode side has a second value, which is smaller than the second value.

14. The bypass thyristor device of claim 1, wherein the first region is arranged between the gate electrode and the anode electrode.

15. The bypass thyristor device of claim 2, wherein the gas expansion volume is divided into at least two separate cavities interconnected for gas exchange.

16. The bypass thyristor device of claim 3, wherein the gas expansion volume comprises at least one trench surrounding the gate contact opening.

17. The bypass thyristor device of claim 15, wherein the gas expansion volume comprises at least one trench surrounding the gate contact opening.

18. The bypass thyristor device of claim 16, wherein the at least one trench is interconnected with the gate contact opening via at least one channel provided in the contact side.

19. The bypass thyristor device of claim 18, wherein the gas expansion volume comprises at least two trenches surrounding the gate contact opening.

20. A converter cell, comprising: at least two power semiconductor switches for connecting a cell capacitor with an output of the converter cell and for disconnecting the cell capacitor from the output; a bypass thyristor device connected in parallel to the cell capacitor;
  wherein the bypass thyristor device, comprising:
    a semiconductor device comprising a thyristor with a
      cathode electrode on a cathode side,
      a gate electrode on the cathode side surrounded by
        the cathode electrode and
      an anode electrode on an anode side;
    an electrically conducting cover element arranged on
      the cathode side and in electrical contact with the
      cathode electrode on a contact side;
    a gate contact element electrically connected to the gate
      electrode and arranged in a gate contact opening in
      the contact side of the cover element;
    wherein the cover element has a gas expansion volume
      in the contact side facing the cathode side, wherein
      the gas expansion volume is interconnected with the
      gate contact opening for gas exchange.

* * * * *